United States Patent [19]

Bertuccio et al.

[11] Patent Number: 5,347,231
[45] Date of Patent: Sep. 13, 1994

[54] LOW NOISE CHARGE SENSITIVE PREAMPLIFIER DC STABILIZED WITHOUT A PHYSICAL RESISTOR

[75] Inventors: Giuseppe Bertuccio, Brianza, Italy; Pavel Rehak, Patchogue, N.Y.; Deming Xi, Beijing, China

[73] Assignee: Associated Universities, Inc., Washington, D.C.

[21] Appl. No.: 21,239

[22] Filed: Feb. 23, 1993

[51] Int. Cl.$^5$ .................................. H03F 3/16
[52] U.S. Cl. ............................. 330/300; 330/311; 330/308; 330/290
[58] Field of Search ............... 330/311, 300, 99, 100, 330/103, 308, 207 R, 290; 250/370.01, 370.05, 370.06, 370.07, 370.08, 370.09, 374

[56] References Cited

U.S. PATENT DOCUMENTS

| | | | |
|---|---|---|---|
| 3,611,173 | 10/1971 | Goulding | 330/290 |
| 3,908,173 | 9/1975 | Murdock | 330/300 |
| 4,164,715 | 8/1979 | Thurmond | 330/85 |
| 4,420,724 | 12/1983 | Owen | 330/290 |
| 4,577,336 | 3/1986 | Kriedt et al. | 377/111 |

*Primary Examiner*—James B. Mullins
*Assistant Examiner*—Jim Dudek
*Attorney, Agent, or Firm*—Margaret C. Bogosian

[57] ABSTRACT

The invention is a novel charge sensitive preamplifier (CSP) which has no resistor in parallel with the feedback capacitor. No resetting circuit is required to discharge the feedback capacitor. The DC stabilization of the preamplifier is obtained by means of a second feedback loop between the preamplifier output and the common base transistor of the input cascode. The input transistor of the preamplifier is a Junction Field Transistor (JFET) with the gate-source junction forward biased. The detector leakage current flows into this junction. This invention is concerned with a new circuit configuration for a charge sensitive preamplifier and a novel use of the input Field Effect Transistor of the CSP itself. In particular this invention, in addition to eliminating the feedback resistor, eliminates the need for external devices between the detector and the preamplifier, and it eliminates the need for external circuitry to sense the output voltage and reset the CSP. Furthermore, the noise level of the novel CSP is very low, comparable with the performance achieved with other solutions. Experimental tests prove that this configuration for the charge sensitive preamplifier permits an excellent noise performance at temperatures including room temperature. An equivalent noise charge of less than 20 electrons r.m.s. has been measured at room temperature by using a commercial JFET as input device of the preamplifier.

10 Claims, 4 Drawing Sheets

LOW NOISE CHARGE SENSITIVE PREAMPLIFIER DC STABILIZED WITHOUT A PHYSICAL RESISTOR

This invention was made with Government support under contract number DE-AC02-76CH00016, between the U.S. Department of Energy and Associated Universities, Inc. The Government has certain rights in the invention.

BACKGROUND OF THE INVENTION

1. Field of the Invention

The invention relates to a novel charge sensitive preamplifier without a physical resistor in parallel with a capacitor in a feedback loop to provide DC stabilization.

2. Description of the Related Art

Charge sensitive preamplifiers (CSPs) are the most commonly used amplifiers for signals delivered by light, radiation and particle detectors. Some examples of these detectors are photodiodes, X-ray detectors and detectors for nuclear and particle physics. The applications of CSPs are in applied research (X-ray spectroscopy in medicine, biology) and in basic research (high energy physics, nuclear physics, astrophysics). When connected to a detector, the CSP gives an output voltage pulse with a maximum amplitude proportional to the amount of the charge delivered by the detector. The precision in the measurement of the electric charge depends on the output noise level of the detector-amplifier system. In spite of the fact that a CSP is inherently a less noisy amplifying configuration, great efforts have been made to reduce the noise level even further. The absence of a resistor in parallel with a capacitor in a feedback loop would reduce the noise level of the preamplifier. However in the prior art the configuration without a resistor requires a complicated reset circuitry and is limited to very low values of the leakage current.

SUMMARY OF THE INVENTION

It is an object of the invention to provide a low noise CSP that is DC stabilized without a physical resistor.

It is another object of the invention to provide a low noise CSP that is DC stabilized without need for external devices between the detector and the preamplifier.

It is still another object of the invention to provide a CSP that is DC stabilized without the need for adding other devices and circuits to provide a discharge path if the physical resistor in the feedback loop is removed.

It is still a further object of the invention to provide a low noise CSP that eliminates the need and expense for an empirical selection process to determine high quality resistors having high resistance values.

The invention is a charge sensitive preamplifier without a resistor in parallel with a feedback capacitor for amplifying the charge signal of a detector. Other objects and advantages of the inention will be apparent from the description of it presented below.

DETAILED DESCRIPTION OF THE INVENTION

Background

Figure 1:
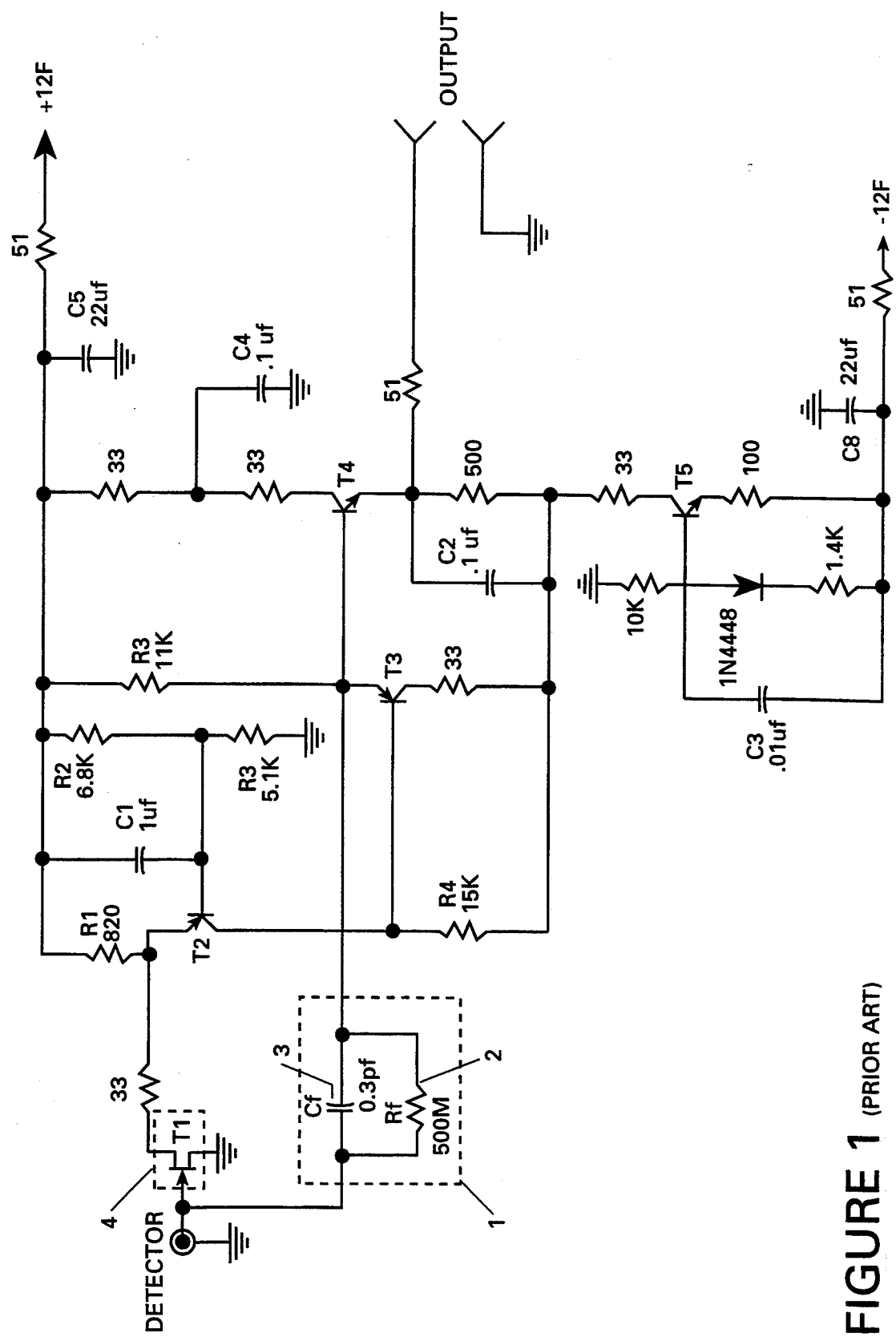
FIG. 1 is a schematic for a prior art CSP with a physical resistor in parallel to a capacitor in a feedback loop.

FIG. 1 is a schematic of a conventional CSP specially designed for low noise applications. The primary source of noise that limits the performance of the conventional CSP is the resistor 2 placed in the feedback loop 1. To have the lowest noise, resistor 2 has to have a very high resistance value, in the range of thousands of $M\Omega$. Unfortunately, very high value resistors show a decreasing resistance as the signal frequency increases up to several kHz. That frequency is within the frequency band of interest for most applications. It is well known that a resistor having a resistance of 1000 $M\Omega$ at low frequency, for example, can exhibit a sharp drop reducing its resistance down to 100 $M\Omega$ at 100 kHz. Moreover, since there is a wide spread in quality among resistors having a high resistance value, each resistor must be empirically selected for good noise performance.

A great advantage, as far as the noise is concerned, would be to eliminate resistor 2 from the feedback loop 1. But if resistor 2 is removed, the CSP cannot work permanently because the lack of a DC feedback path and the lack of a discharging path for the feedback capacitor 3 causing the CSP to fall into saturation. Therefore, with a prior art CSP, it is possible to operate without resistor 2 only by adding other devices and circuits to the CSP in order to neutralize the charge accumulated on the feedback capacitor.

Figure 2A:
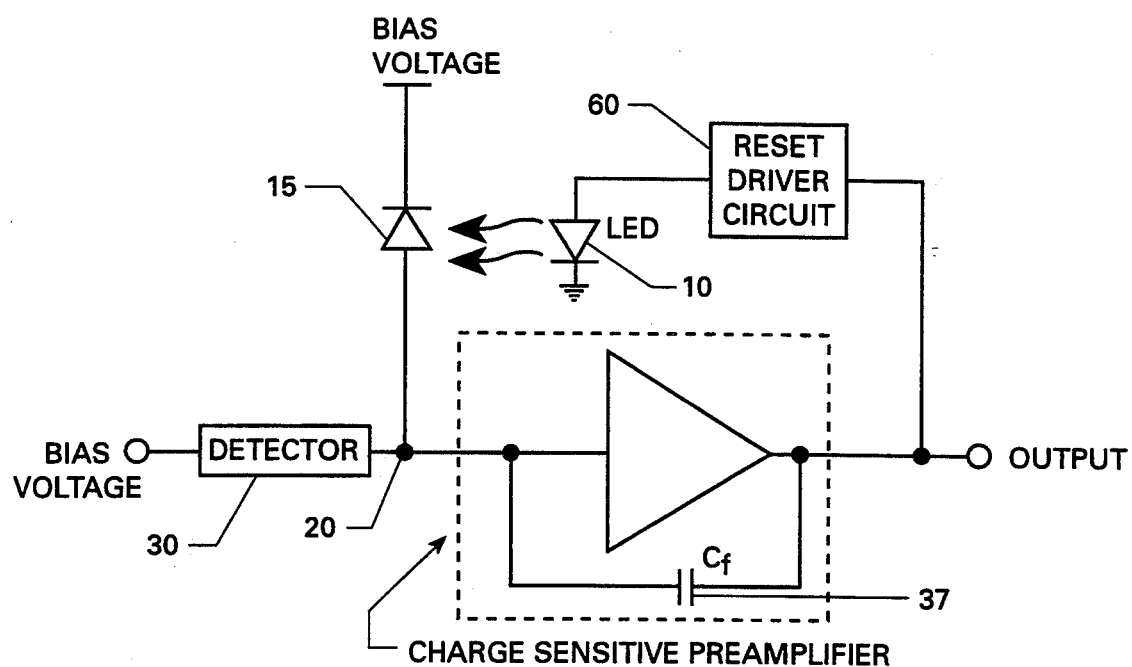
FIGS. 2a–2d are schematics for prior art solutions adopted to maintain a CSP in operating condition without a resistor in the feedback loop.
Figure 2B:
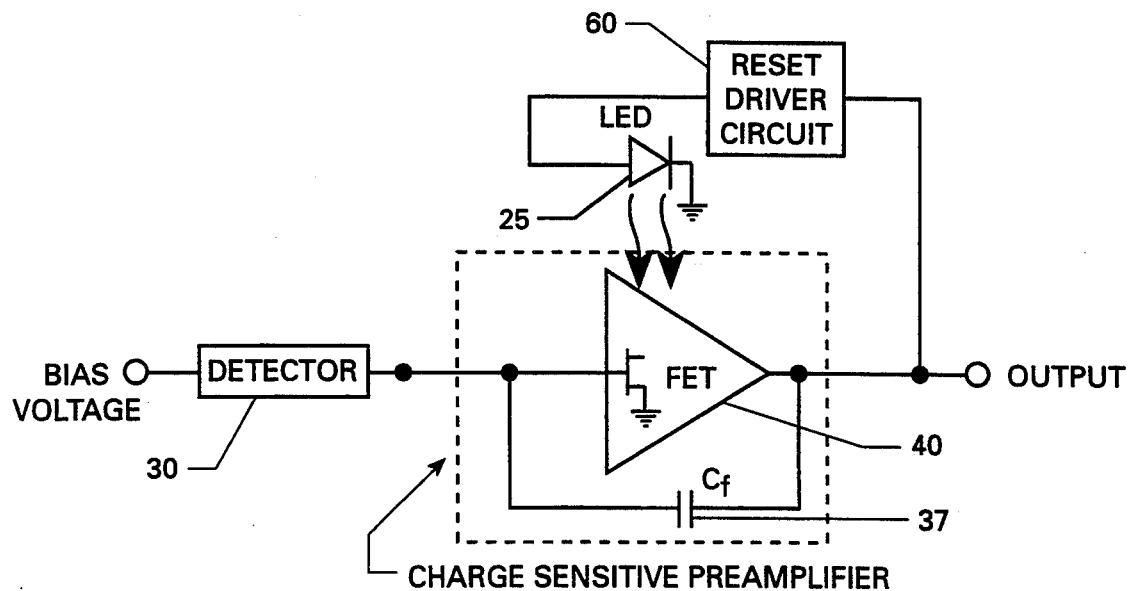

FIGS. 2a–2d show previous solutions adopted to maintain a CSP in operating condition without resistor 2 in feedback loop 1. FIG. 2a is an "opto-electronic feedback" which requires LED 10, light emitting diode, optically coupled with photodiode 15 connected to the input 20 of the preamplifier. Also, an additional electronic circuit 60 is required to drive the LED 10 performing the operation of resetting the CSP. As detector 30 is light sensitive, the problem arising from this solution is that a perfect optical insulation must be guaranteed for use between the LED 10 and the detector 30. FIG. 2b is a "light pulsed feedback to the input FET". This approach adopts the same principle as the opto-electronic feedback shown in FIG. 2a. The difference between the two is that the photodiode 15 is replaced by the gate-channel junction of the FET 40. Again, a perfect optical insulation between the LED 25 and detector 30 is also required with this feedback method.

Figure 2C:
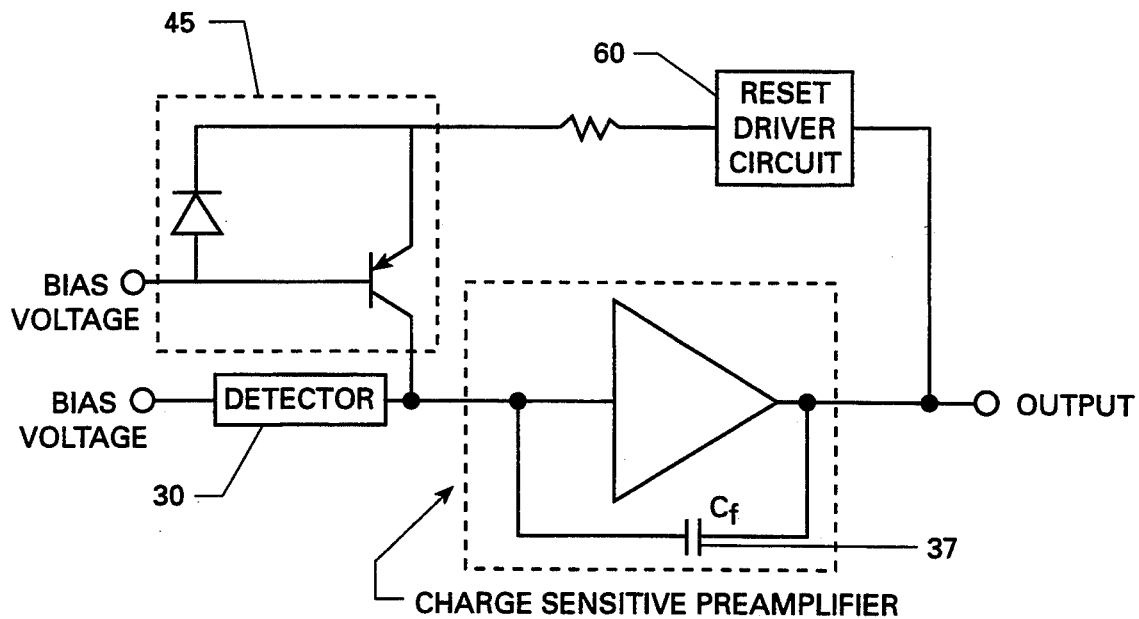

FIG. 2c is a "transistor pulsed feedback". This technique uses transistor current switch 45 connected to the input of the preamplifier. Switch 45 performs the same action as the LED 10 and the photodiode 15 in the optoelectronics feedback system.

Figure 2D:
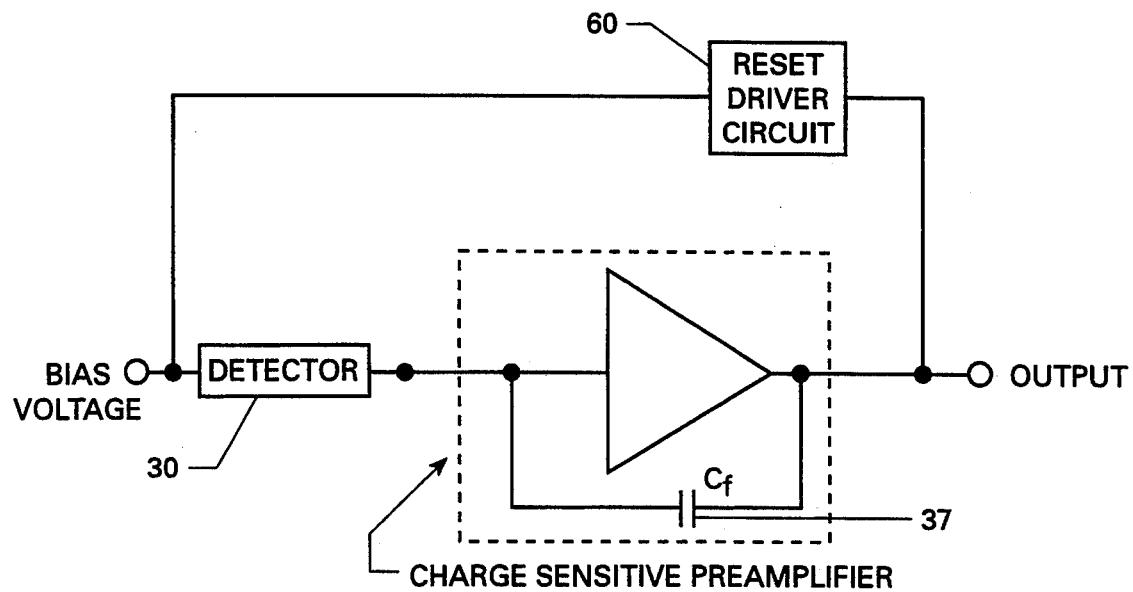

FIG. 2d shows the "charge pump via the detector capacitance" method. The resetting charge is forced by a step voltage applied at the detector cathode.

To remove the charge on the feedback capacitor 37, all of the systems shown in FIGS. 2a–2d require an additional electronic circuit, indicated in the Figures as reset driver circuit 60, which senses the output voltage of the preamplifier. When this output voltage exceeds a certain value, the sensing circuit 60 generates a resetting pulse feeding the LEDs 10 and 25, the transistor switch 45 or the detector 30 itself respectively.

The systems shown in FIG. 2a and FIG. 2c also require an additional device, photodiode 15 or transistor switch 45, connected to the input of the CSP. Adding external devices between the detector and the preamplifier degrades the performance of all detectors with very low output capacitance, less than 1 pF.

DESCRIPTION OF THE PREFERRED EMBODIMENT

Figure 3:
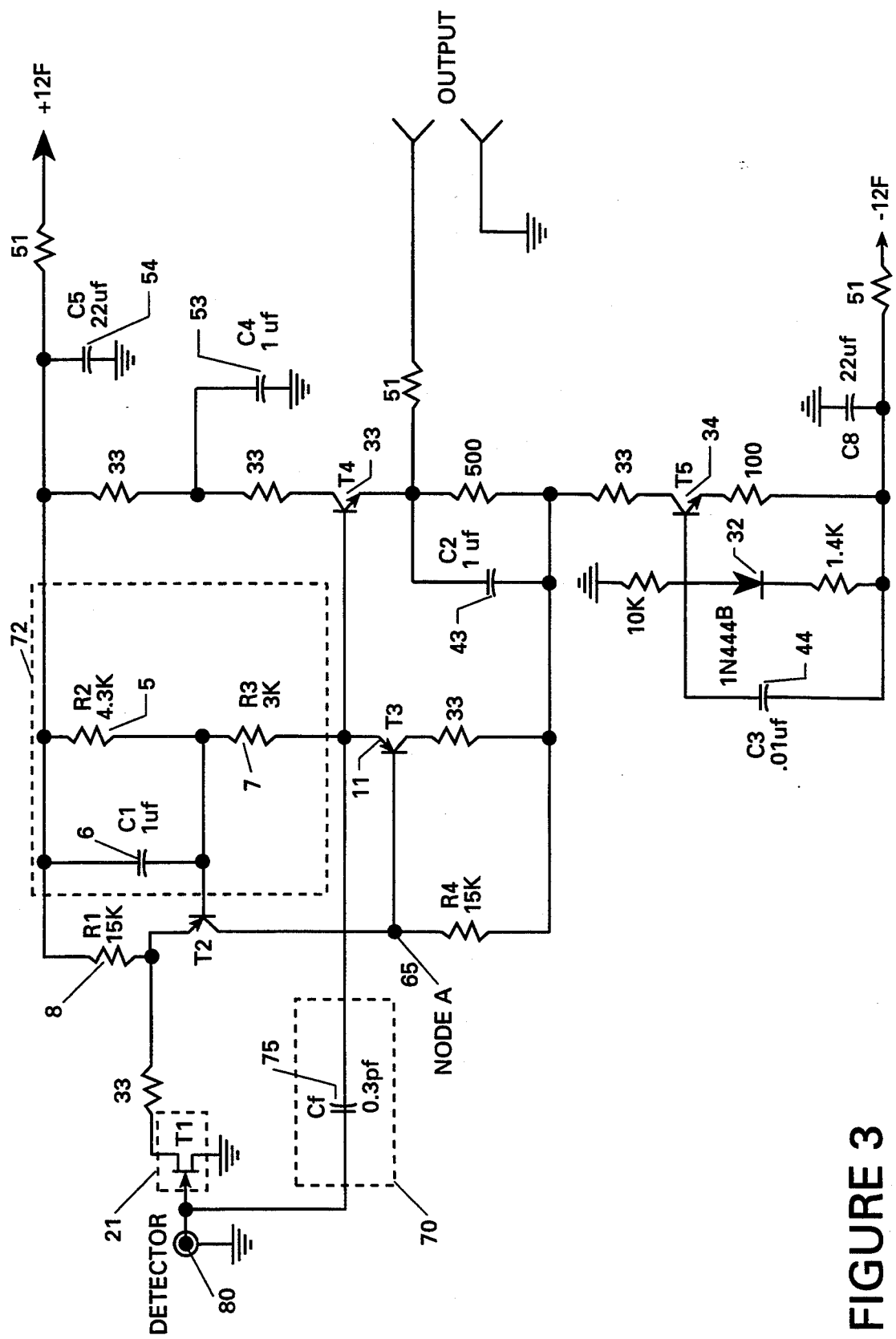
FIG. 3 is a schematic for the CSP in accordance with the invention.

FIG. 3 is a schematic for the novel CSP in accordance with the invention. The two feedback loop networks 70 and 72 are used. The feedback network 70 has no resistor in parallel with the capacitor 75. The primary difference between the invention and conventional CSPs is that a conventional CSP uses a resistor in the feedback network 1 (FIG. 1) while the invention has no resistor in the feedback network 70. However, there are other differences as well. The invention eliminates the need for any external devices between the detector and the CSP. Also, the invention eliminates the need for external circuitry to sense the output voltage and reset the CSP. Most importantly, the noise level of the invention is low when compared to the performance achieved with the other above mentioned solutions. This is accomplished by the use of second feedback loop 72 comprising low pass filter consisting of resistors 5 and 7 and capacitor 6 which feeds the output signal of transistor 11 to the base of transistor 12. Also, the novel use of FET 21 which operates with the gate to source junction forward biased, (meaning the voltage of the CSP input is positive or zero) is distinguished from the conventional CSP which operates with the gate to channel junction reversed biased (meaning the voltage of the CSP input is negative, an N-channel FET is assumed).

FET 21 is preferably an N-channel Junction Field Effect Transistor (JFET), however, a P-channel JFET can also be used with an appropriate modification to the circuit. Initially, type 2N4416 commercially available from Texas Instrument was used. In later experiments, type NJ26 Die commercially available from Interfet was used. In order to eliminate stray noise sources FET 21 is preferably mounted on a printed circuit board on Teflon ®, commercially available from Norplex Oak, Inc. Feedback capacitor 75 was obtained by placing two parallel metallic strips in proximity of the FET 21 on the same printed circuit board.

Resistor 8 is selected depending on the characteristics of FET 21. For example, if a JFET NJ26 is used as FET 21, which has a drain saturation current of 3mA and a pinch-off voltage of 1.2 volts, the value of the resistor 8 is preferably 3kΩ.

Transistor 12 is preferably a pnp bipolar transistor H81 commercially available from Motorola, Inc. Transistor 11 is preferably a pnp bipolar 2N3906 commercially available from Motorola. Transistors 33 and 34 are NPN bipolar type 2N3904 commercially available from Motorola. All the resistors in the circuit are preferably commercial metal film resistor 1/8 watt. Capacitors 6, 43 and 44 are commercial mica capacitors. While, capacitors 53 and 54 are electrolytic capacitors. The diode 32 is a commercial type 1N4446.

In the configuration shown in FIG. 3, the detector 80 is connected to the input of the CSP in such a way that its leakage current enters into the preamplifier input. An alternative embodiment of the invention is achieved by using a P-channel JFET as FET 21. In this case, detector 80 has to be connected in such a way as its leakage current comes out of the preamplifier input.

OPERATION

The working principle of the invention can be explained as follows. When the current pulse, delivered by detector 80, feeds the preamplifier, transistor 12 behaves like a common base transistor due to the capacitor 6, so all the drain signal current from FET 21 is driven in the high impedance at node 65. The middle-band voltage gain of the amplifier can be made very high, of the order of some hundreds, so a high loop gain is guaranteed and all the electric signal charge Q from the detector is accumulated on the feedback capacitor 75, $C_f$. The output signal voltage shows a maximum $V_o = Q/C_f$, proportional to the charge Q, as in the conventional charge sensitive preamplifiers.

Subsequently, feedback capacitor 75 is discharged by the current flowing in the gate to source junction of FET 21, which is slightly forward biased as has been previously shown. The discharge time constant is, in a first approximation, the product of the dynamic resistance of the gate to source diode times the total capacitance between the preamplifier input and ground.

The function of the second feedback loop 72, that is unique to the invention, is: (1) It defines the DC operating point of transistors 12, 11 and 33, by imposing a well defined voltage in node 65 of the preamplifier. (2) It lowers the DC and low frequency gain of the preamplifier from the middle band gain of some hundreds down to about 10. Although the preferred embodiment of the circuit shown in FIG. 3 uses transistor 11 as an output transistor, it will be understood that the output could be taken from transistor 33.

The two functional aspects of feedback loop 72 are connected to one another. The second function of feedback loop 72 permits the input of the preamplifier, corresponding to the gate of FET 21, to self adjust its voltage value in order that the gate to source junction of FET 21 can be forward biased and collect all the leakage current from the detector and from the gate to drain junction of FET 21 itself. FET 21 and transistor 12 comprise the input cascode for the circuit. The variations of the DC voltage at the input of the CSP are related to the variations of the leakage current of the detector, which can be caused by temperature variations or by the radiation damage of the detector. Since the leakage current is drained away by the gate to source junction, the voltage at the preamplifier input has a logarithmic dependence on the leakage current of the detector. Therefore, there is no significant variation in the preamplifier DC operating point for variations of the leakage current for several orders of magnitude. This is possible because feedback loop 72 lowers the DC voltage gain of the preamplifier, permitting the input voltage to vary in the range of hundreds of millivolts.

The invention avoids the necessity to put a high value resistance in parallel with the feedback capacitor and avoids the use of some devices and circuits, external to the preamplifier itself, to perform the discharging of the feedback capacitor. The main feedback loop 70 performs the charge to voltage conversion by means of feedback capacitor 75. The second feedback loop 72 stabilizes the DC operating point of the CSP. The DC equilibrium point is reached when the current flowing through the gate to source junction of the input FET 21 becomes equal to the leakage current of the detector 80 and of the gate to drain junction of the FET 21.

The input FET 21 works with the gate to channel junction slightly forward biased at the source end of the gate. This arrangement is novel, since, in general, JFETs are always used with the gate to source junction reverse biased.

Experimental tests of the invention have confirmed the expected noise performance at room temperature (18° C.). The Equivalent Noise Charge (ENC) was measured versus the shaping time constant of a semi-gaussian shaper amplifier model ORTEC 450. The ENC decreases monotonically up to the maximum shaping time available, 10 us, where the ENC value is as low as 19.5 electrons r.m.s. silicon equivalent. This noise level was measured with a JFET type NJ26, commercially available from Interfet, that has a maximum transconductance of 3.7 mS. The total capacitance the input of the preamplifier is 5.5 pF. The measured noise level was found to be much lower than the noise level, at the same temperature, found with a CSP having a selected high value feedback resistor. It is expected that at cryogenic temperature, the invention will have an equivalent noise charge comparable or lower than the values obtained by the other mentioned techniques.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

We claim:

1. A charge sensitive preamplifier without a resistor or resistance components in parallel with a feedback capacitor for amplifying a charge delivered by a detector comprising:
   an input cascode having a first and a second transistor, the second transistor behaving as being in a common base configuration;
   first feedback means comprising a capacitor connected between an output transistor and said detector, for performing the charge to voltage conversion; and
   second feedback means, connected between said output transistor and the base of the second transistor of said input cascode, for stabilizing the DC operating point of said preamplifier.

2. The apparatus of claim 1 wherein said first transistor of the input cascode comprises a JFET.

3. The apparatus of claim 2 wherein said JFET has its gate-source junction forward biased.

4. The apparatus of claim 3 wherein said JFET collects all the leakage current from said detector and from the gate to drain junction of said JFET.

5. The apparatus of claim 4 wherein said JFET is a N-channel type.

6. The apparatus of claim 4 wherein said JFET is a P-channel type.

7. A charge sensitive preamplifier without a resistor in parallel with a feedback capacitor for amplifying a charge delivered by a detector comprising:
   an input cascode having a first and a second transistor, the second transistor behaving as being in a common base configuration;
   first feedback means comprising a capacitor connected between an output transistor and said detector, for performing the charge to voltage conversion; and
   a second feedback loop comprising a low-pass filter connected between the output of the preamplifier and the input cascode of said first transistor for lowering the DC voltage gain and stabilizing the operating point of said preamplifier, while maintaining a high middle band voltage gain.

8. The apparatus of claim 7 wherein said low-pass filter comprises a capacitor that is effective to cut off high frequency components of the output signal.

9. The apparatus of claim 7 wherein said low-pass filter does not permit the DC and low frequency components of the detector current feeding the preamplifier to significantly charge the feedback capacitor of the preamplifier.

10. The apparatus of claim 7 wherein said second feedback loop operates to lower the DC voltage gain of the preamplifier to permit its input voltage to vary in the range of hundreds of millivolts.

* * * * *